(12) United States Patent
Hirokawa (10) Patent No.: US 11,996,225 B2
(45) Date of Patent: May 28, 2024

(54) POWER SUPPLY APPARATUS

(71) Applicant: TDK CORPORATION, Tokyo (JP)

(72) Inventor: Akihiko Hirokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 696 days.

(21) Appl. No.: 17/144,258

(22) Filed: Jan. 8, 2021

(65) Prior Publication Data

US 2021/0233693 A1    Jul. 29, 2021

(30) Foreign Application Priority Data

Jan. 28, 2020  (JP) ................................ 2020-011653

(51) Int. Cl.
  *H01F 27/02*   (2006.01)
  *H05K 1/18*    (2006.01)
  *H05K 3/30*    (2006.01)

(52) U.S. Cl.
  CPC ........... *H01F 27/027* (2013.01); *H05K 1/181* (2013.01); *H05K 3/303* (2013.01)

(58) Field of Classification Search
  CPC .... H05K 5/0052; H05K 5/0056; H05K 5/006; H05K 5/03; H05K 7/20436; H05K 7/209; H05K 1/181; H05K 3/303; H05K 7/2039; H01F 27/027
  See application file for complete search history.

(56) References Cited

U.S. PATENT DOCUMENTS

| | | | |
|---|---|---|---|
| 2005/0083665 A1* | 4/2005 | Nakashima | H05K 1/181 361/767 |
| 2015/0048917 A1* | 2/2015 | Uchiyama | H05K 1/0209 336/200 |
| 2015/0351226 A1* | 12/2015 | Lasagni | H05K 1/181 29/830 |
| 2017/0164480 A1* | 6/2017 | Liu | H05K 1/182 |
| 2018/0159018 A1 | 6/2018 | Asano | |
| 2021/0166860 A1* | 6/2021 | Silva | H05K 1/181 |

FOREIGN PATENT DOCUMENTS

| | | |
|---|---|---|
| CN | 204668108 U | 9/2015 |
| CN | 208257660 U | 12/2018 |
| JP | 3583602 B2 * | 11/2004 |
| JP | 2006-344812 A | 12/2006 |

OTHER PUBLICATIONS

Translation of Yamaguchi JP 3583602 B2 (Year: 2004).*

* cited by examiner

*Primary Examiner* — Jacob R Crum
(74) *Attorney, Agent, or Firm* — Oliff PLC (57) ABSTRACT

A power supply apparatus includes a board including a major surface on which a circuit element group is mounted, and a case attached to the board. The case includes a plate-shaped portion that is located at a distance from the board and faces the major surface, and a side wall portion extending from the plate-shaped portion toward one end portion of the board. One end of a specific circuit element among the circuit element group reaches the one end portion of the board, the one end of the specific circuit element being directed to the side wall portion. The side wall portion is provided with a notch portion with a shape corresponding to an outer shape of the one end of the specific circuit element.

12 Claims, 7 Drawing Sheets

POWER SUPPLY APPARATUS

CROSS-REFERENCE TO RELATED APPLICATION

This application claims the benefit of Japanese Patent Application No. 2020-011653, filed on Jan. 28, 2020, the entire disclosure of which is incorporated by reference herein.

FIELD

The present disclosure relates generally to a power supply apparatus.

BACKGROUND

In an electronic device such as a power supply apparatus, there is known a structure in which a case is attached to a board. For example, Unexamined Japanese Patent Application Publication No. 2006-344812 discloses a structure in which circuit elements such as a capacitor and an integrated circuit (IC) mounted on the board are covered by a case. The case disclosed in Unexamined Japanese Patent Application Publication No. 2006-344812 has an elongated box shape, and includes side plates extending from a top surface (a covering portion in the Patent Literature) toward the board in order to increase the rigidity of the case in the width direction (see FIG. 4 and the like of the Patent Literature). The side plates of the case are located on end portions of the board.

SUMMARY

In the structure disclosed in Unexamined Japanese Patent Application Publication No. 2006-344812, when the circuit elements mounted on the board generate heat, there is a possibility that the side plates of the case prevent heat radiation. In addition, in this structure, since circuit elements cannot be disposed on end portions of the board, at which the side plates are located, due to the presence of the side plates, the layout of circuit elements is restricted.

The present disclosure has been made in consideration of the above circumstance, and the objective of the disclosure is to provide a power supply apparatus which includes a case that is attached to a board, and which can secure heat radiation and allows good layout of circuit elements.

In order achieve the above objective, a power supply apparatus according to the present disclosure includes:
 a board including a major surface on which a circuit element group is mounted; and
 a case attached to the board, wherein
 the case includes a plate-shaped portion that is located at a distance from the board and faces the major surface, and a side wall portion extending from the plate-shaped portion toward one end portion of the board,
 one end of a specific circuit element among the circuit element group reaches the one end portion of the board, the one end of the specific circuit element being directed to the side wall portion, and
 the side wall portion is provided with a notch portion with a shape corresponding to an outer shape of the one end of the specific circuit element.

The case may include, in addition to a first side wall portion functioning as the side wall portion, a second side wall portion that is opposed to the first side wall portion and extends from the plate-shaped portion toward an other end portion of the board, and
 the second side wall portion may be provided with a notch portion with a shape corresponding to an outer shape of an other end of the specific circuit element.

The power supply apparatus may satisfy at least one of a condition that the one end of the specific circuit element is located within the notch portion provided in the first side wall portion, and a condition that the other end of the specific circuit element is located within the notch portion provided in the second side wall portion.

The specific circuit element may be a transformer.

The specific circuit element may be a circuit element with a largest outer shape among the circuit element group.

According to the present disclosure, while a case that is attached to a board is provided, heat radiation can be secured and circuit elements can be well laid out.

BRIEF DESCRIPTION OF THE DRAWINGS

A more complete understanding of this application can be obtained when the following detailed description is considered in conjunction with the following drawings, in which.

DETAILED DESCRIPTION

A power supply apparatus according to an embodiment of the present disclosure will be described with reference to the accompanying drawings.

Figure 1:
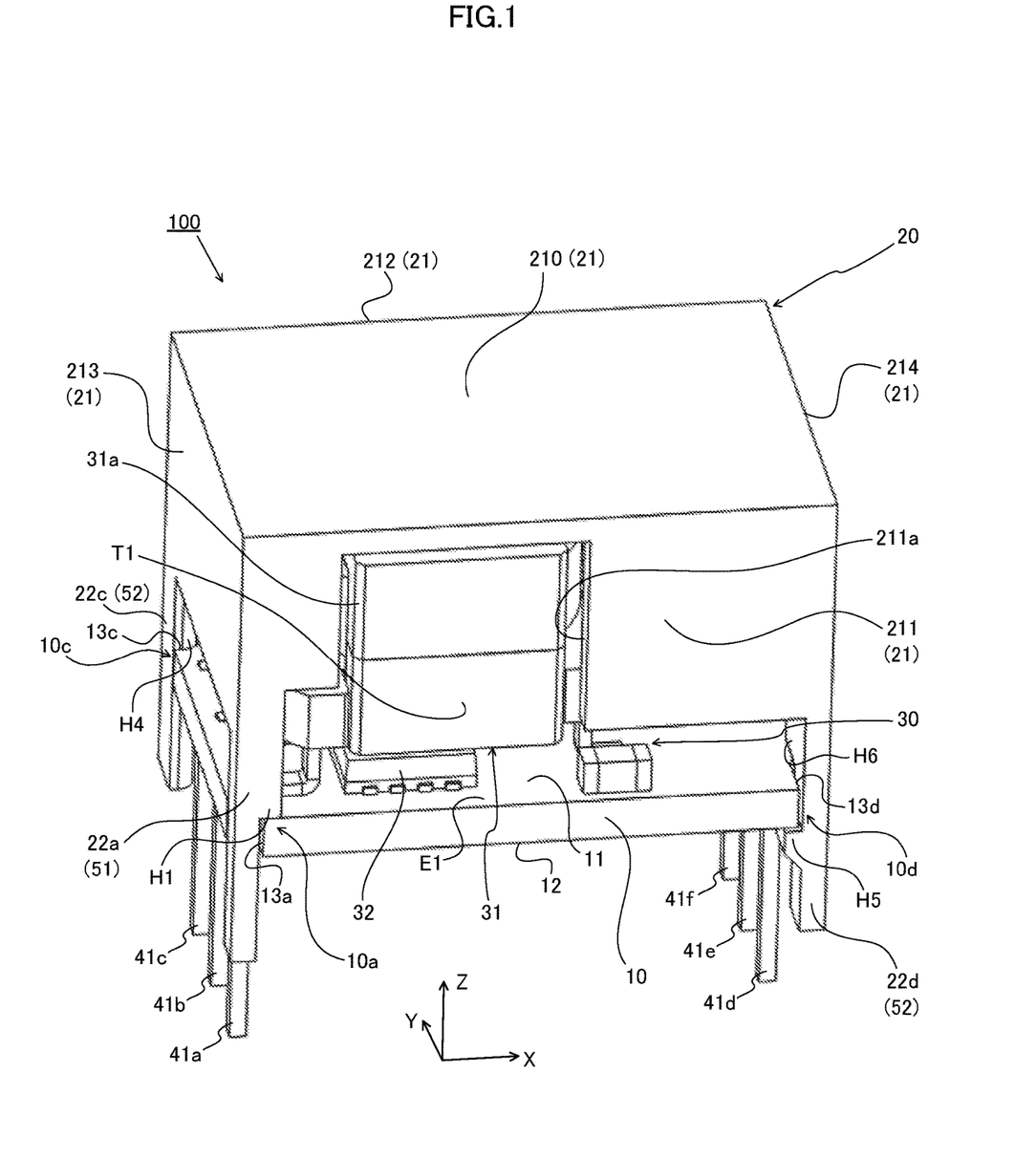
FIG. 1 is a perspective view of a power supply apparatus according to an embodiment of the present disclosure.
Figure 2:
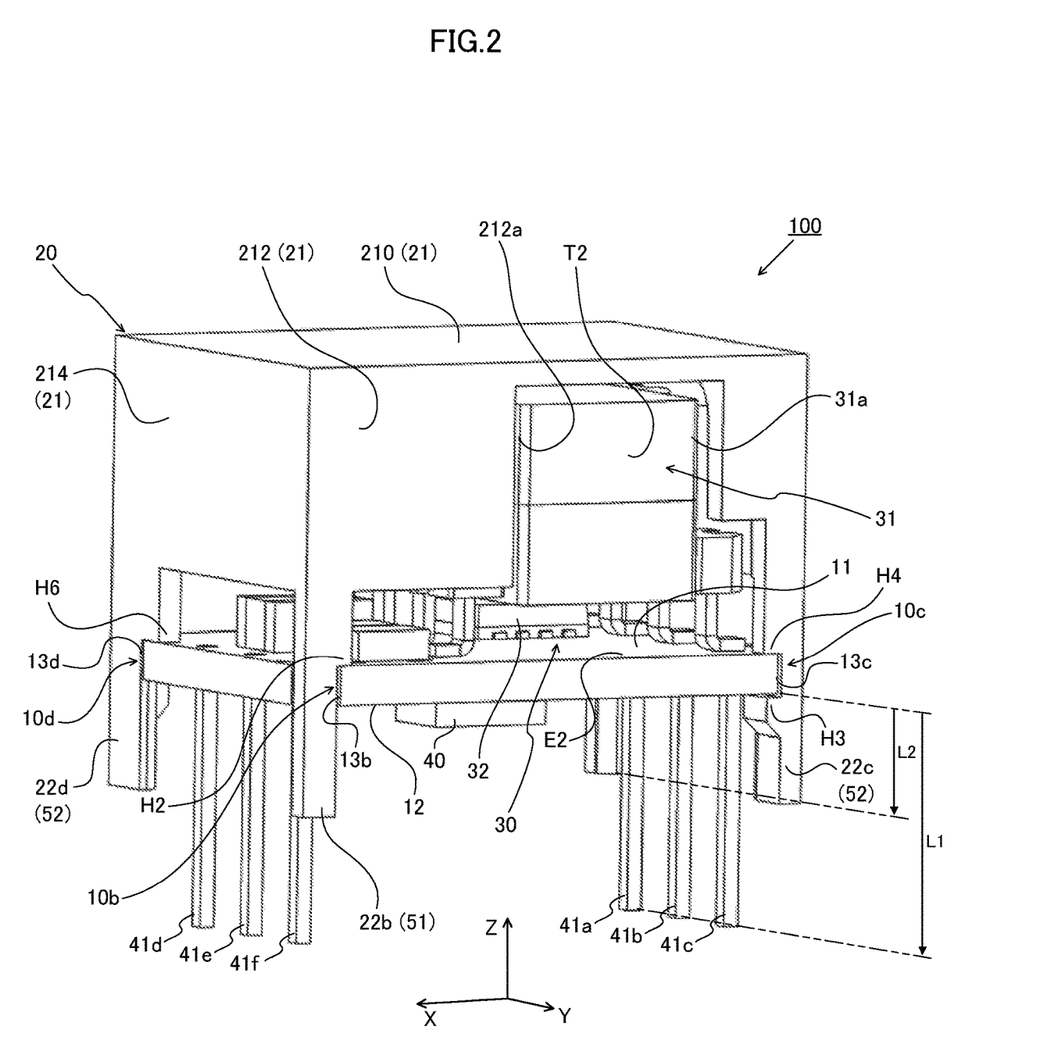
FIG. 2 is a perspective view of the power supply apparatus, as viewed in a direction different than in FIG. 1.

As illustrated in FIG. 1 and FIG. 2, a power supply apparatus 100 includes a board 10 on which a power supply circuit that generates necessary output power from input power is formed, and a case 20 attached to the board 10. The power supply circuit functions, for example, as a DC-DC converter in which at least one of a step-up circuit and a step-down circuit can be implemented.

Figure 3:
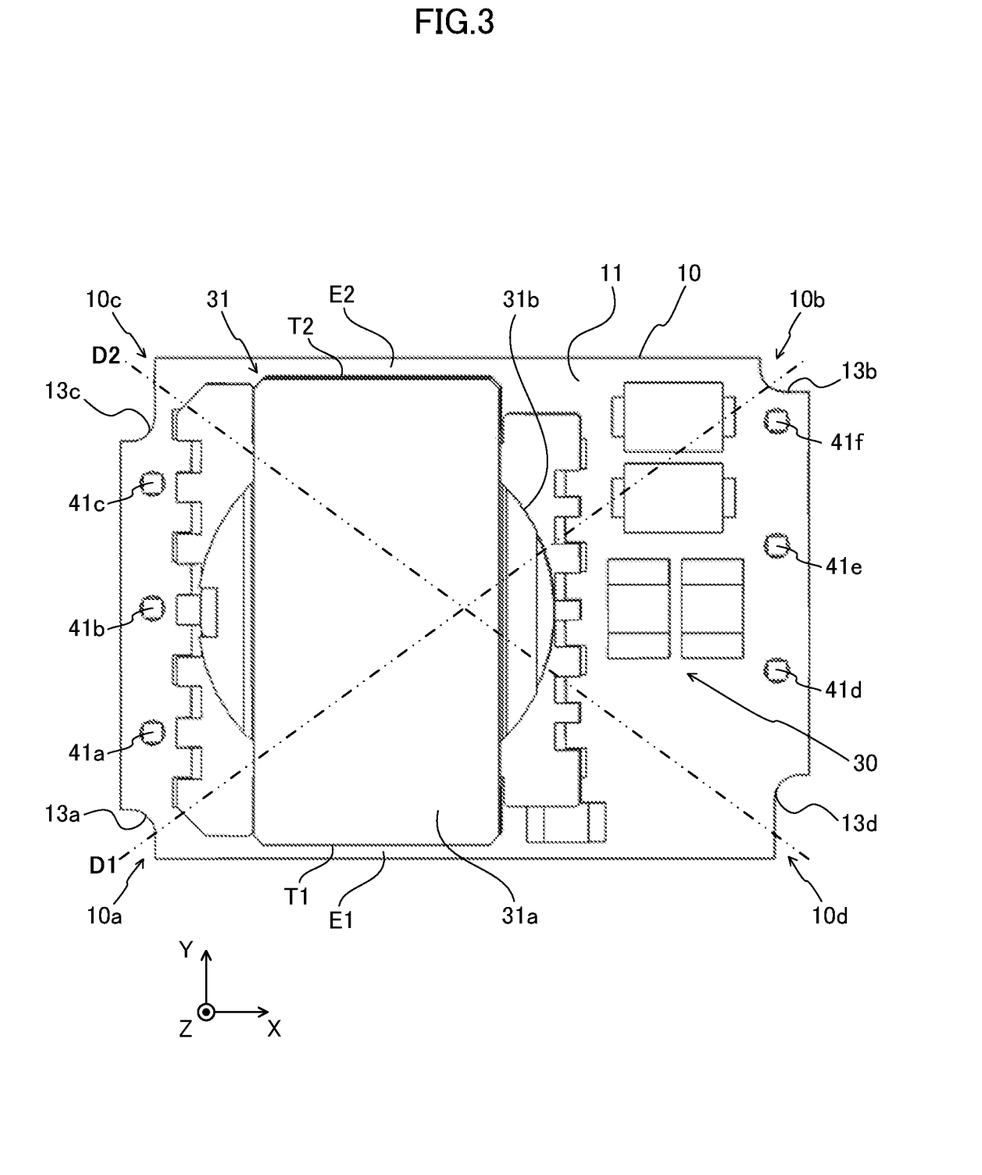
FIG. 3 is a plan view of a board which the power supply apparatus according to the embodiment includes.

The board 10 is constituted by a rigid board on which circuitry wiring lines (not shown) formed of conductors such as copper foils are formed. As illustrated in FIG. 3, the board 10 has a substantially rectangular shape in plan view. Hereinafter, as illustrated in the respective drawings, in some cases, the configuration of the power supply apparatus 100 will be described by using an X axis along long sides of the substantially rectangular board 10, a Y axis along short sides of the board 10, and a Z axis perpendicular to the X axis and Y axis.

Figure 4:
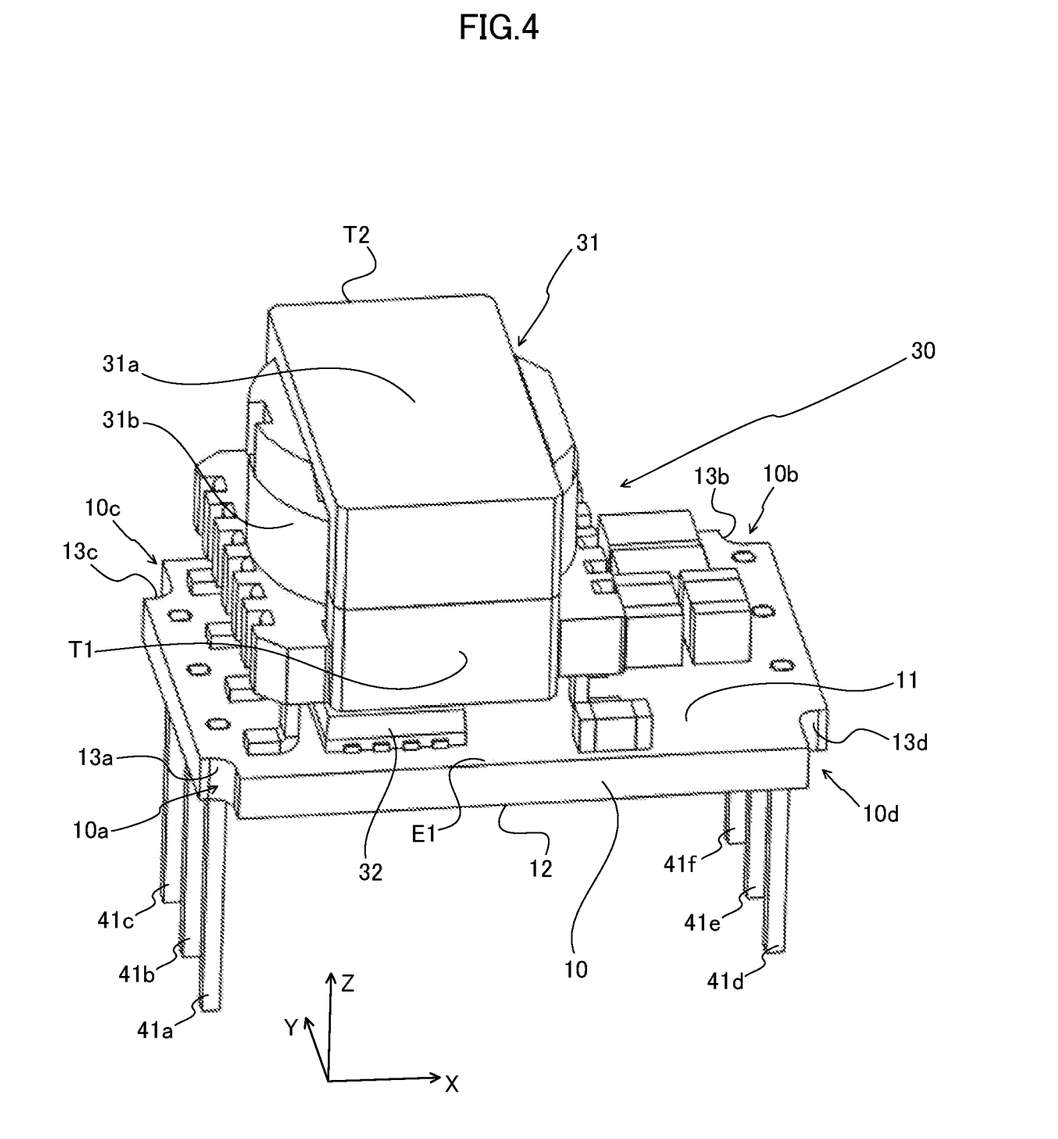
FIG. 4 is a view illustrating a state in which a case is detached from the power supply apparatus illustrated in FIG. 1.

The board 10 constitutes a printed circuit board (PCB) by mounting a plurality of circuit elements, which constitute the power supply circuit, on a major surface 11 that is one surface and on a back surface 12 that is the other surface. As illustrated mainly in FIG. 3 and FIG. 4, a circuit element group 30, which includes a transformer 31 and a switching element 32 comprising, for example, a MOSFET, is mounted on the major surface 11 of the board 10. The transformer 31 includes a core 31a formed of, for example, ferrite; a coil unit 31b comprising a primary coil and a secondary coil which are wound around the core 31a and are insulated from each other; and an insulation coating (not shown) covering the coil unit 31b.

The power supply circuit according to the present embodiment comprises a publicly known circuit functioning as an insulation-type DC-DC converter of a switching method in which an electric current flowing in the transformer 31 is controlled by the switching element 32. For example, the power supply circuit constitutes a flyback-type converter or a forward-type converter, which controls, by the switching element 32, the current flowing in the primary coil of the transformer 31 to which an input voltage is applied, and generates a desired output voltage on the secondary coil side of the transformer 31. A controller 40 which controls the operation of the switching element 32, and other circuit elements (not shown) are mounted on the back surface 12 of the board 10. Note that the circuit element group 30 mounted on the major surface 11 of the board 10 and the circuit elements (not shown) mounted on the back surface 12 of the board 10 include necessary circuit elements for constituting the power supply circuit, such as a capacitor, a diode and a resistor.

In addition, the board 10 is provided with six pin terminals 41a to 41f extending perpendicular to the back surface 12 of the board 10 in such a manner as to extend away from the board 10. By the pin terminals 41a to 41f, the power supply apparatus 100 is electrically connected to an electronic device that is a target to which the power supply apparatus 100 is attached. The pin terminals 41a to 41f include input terminals 41a to 41c to which an input voltage is applied, and output terminals 41d to 41f to which an output voltage is applied. As illustrated in FIG. 2, a length L1 of each pin terminal, 41a to 41f, from the back surface 12 is set to be equal.

Here, among the circuit element group 30 mounted on the major surface 11 of the board 10, the transformer 31 that is an example of a specific circuit element has a greater outer shape than the other circuit elements, and becomes a factor that imposes restrictions to the shape of the case 20, as will be described later. As illustrated mainly in FIG. 3, the transformer 31 includes, for example, an EE-type core which is elongated in the Y direction. One end T1 of the core 31a in the Y direction (hereinafter, also referred to as "one end T1 of the transformer 31") reaches one end portion E1 of the board 10 in the Y direction (a lower end portion in FIG. 3). The other end T2 of the core 31a in the Y direction (hereinafter, also referred to as "the other end T2 of the transformer 31") reaches the other end portion E2 of the board 10 in the Y direction (an upper end portion in FIG. 3). In addition, a height in the Z direction of the transformer 31 from the major surface 11 is greater than the height of the other circuit elements constituting the circuit element group 30.

It suffices that each of one end portion E1 and the other end portion E2 of the board 10 is a portion which includes a part corresponding to a side extending in the X direction of the board 10 and which has a certain width from the side toward the inside of the board 10. In the present embodiment, the one end portion E1 of the board 10 includes at least a part covered by a first side wall portion 211 (to be described later) of the case 20 in plan view. Similarly, the other end portion E2 of the board 10 includes at least a part covered by a second side wall portion 212 (to be described later) of the case 20, as viewed in the Z direction.

As illustrated in FIG. 3, notches 13a to 13d with shapes recessed toward the inside of the board 10 are formed in corner portions 10a to 10d corresponding to the four corners of the board 10 that is substantially rectangular in plan view. The notches 13a to 13d are formed to have arcuate edge portions in plan view. The corner portions 10a and 10b are located at corners on one diagonal D1 on the board 10. The corner portions 10c and 10d are located at corners on the other diagonal D2 on the board 10. Although details will be described later, the notches 13a to 13d function as parts with which leg portions 22a to 22d (to be described later) of the case 20 are to be engaged.

Figure 5:
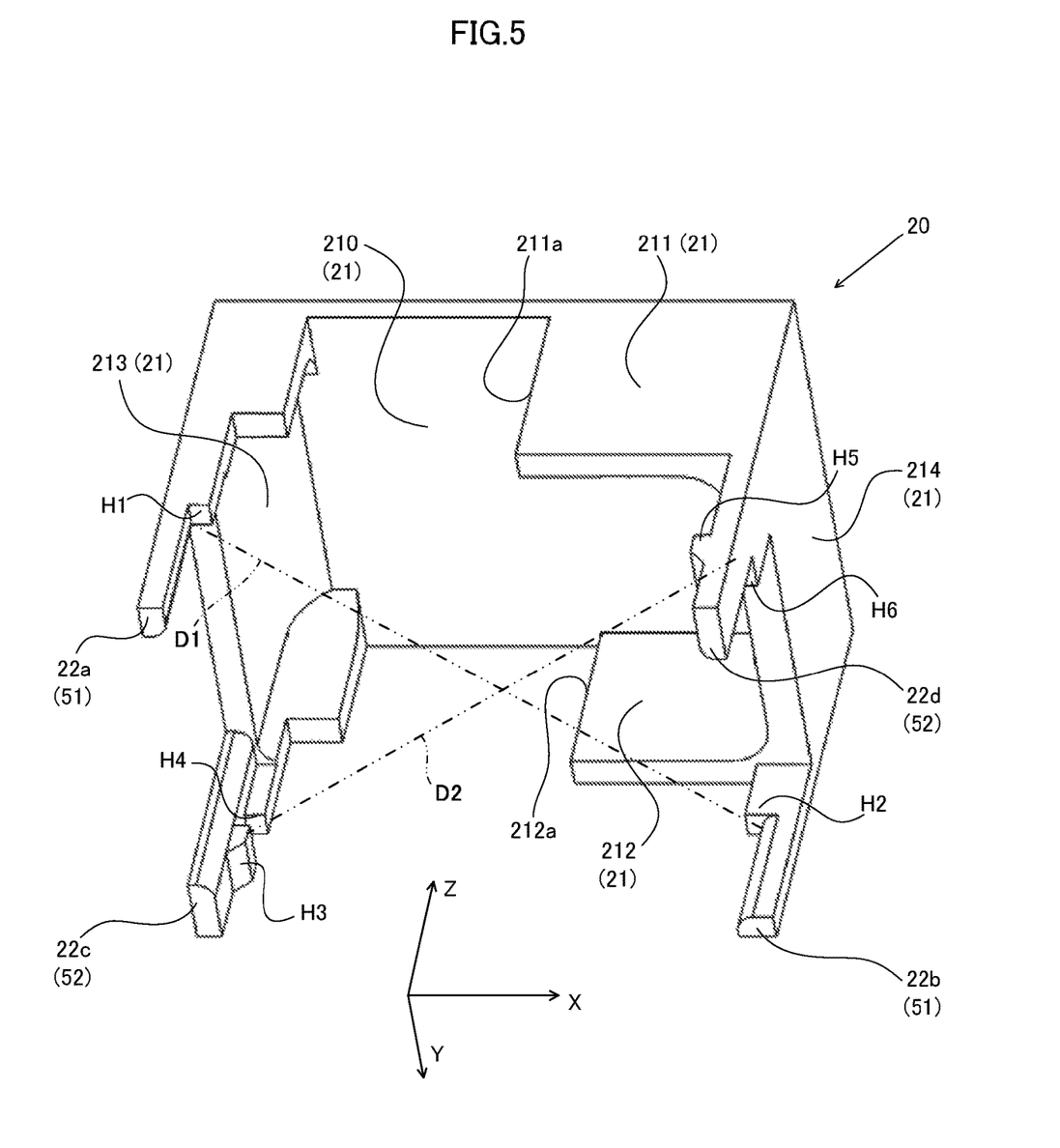
FIG. 5 is a perspective view of the case which the power supply apparatus according to the embodiment includes.

As illustrated in FIG. 1, FIG. 2 and FIG. 5, the case 20 includes a cover portion 21 covering the major surface 11 of the board, and a plurality of leg portions 22a to 22d extending from the cover portion 21 toward the board 10, and is formed of, for example, a resin as one piece.

The cover portion 21 has a box shape opening toward the board 10, and covers the major surface 11 of the board 10. For example, the outer shape of the cover portion 21 in plan view is set to have a substantially equal size to the outer shape of the board 10. The cover portion 21 includes a rectangular plate-shaped portion 210, and first to fourth side wall portions 211 to 214 extending downward from the respective sides of the plate-shaped portion 210 toward the board 10.

The plate-shaped portion 210 faces the major surface 11 of the board 10 at a distance, and is disposed substantially parallel to the board 10. A top surface (an upper surface in FIG. 1) of the plate-shaped portion 210 functions as a part which is sucked by a suction nozzle of an automatic mounter when the power supply apparatus 100 is installed on the electronic device of the target.

As illustrated in FIG. 5, the first side wall portion 211 and second side wall portion 212 are provided to correspond to the long sides of the plate-shaped portion 210, and are opposed to each other in the Y direction. The third side wall portion 213 and fourth side wall portion 214 are provided to correspond to the short sides of the plate-shaped portion 210, and are opposed to each other in the X direction.

The first side wall portion 211 is provided with a notch portion 211a which exposes the one end T1 of the transformer 31 to the outside of the case 20. Specifically, the notch portion 211a is formed in a shape corresponding to the outer shape of the one end T1 of the transformer 31. In addition, the notch portion 211a is formed to be slightly greater than the outer shape of the one end T1 of the transformer 31, as viewed in the Y direction, such that the first side wall portion 211 does not come in contact with the transformer 31. The second side wall portion 212 is provided with a notch portion 212a which exposes the other end T2 of the transformer 31 to the outside of the case 20. Specifically, the notch portion 212a is formed in a shape corresponding to the outer shape of the other end T2 of the transformer 31. In addition, the notch portion 212a is formed to be slightly greater than the outer shape of the other end T2 of the transformer 31, as viewed in the Y direction, such that the second side wall portion 212 does not come in contact with the transformer 31. The shape of the notch portion corresponding to the outer shape of the end T1, T2 includes such a shape that the shape of the notch portion corresponds to only a part of the components constituting the transformer 31, for example, a shape corresponding to only the core 31*a* of the transformer 31, or a shape corresponding to only the coil unit 31*b*. Note that, from the standpoint of securing the rigidity of the case 20, the notch portions 211*a* and 212*a* are preferably formed as small as possible within a range in which the first side wall portion 211 and second side wall portion 212 are not in contact with the transformer 31.

Figure 6:
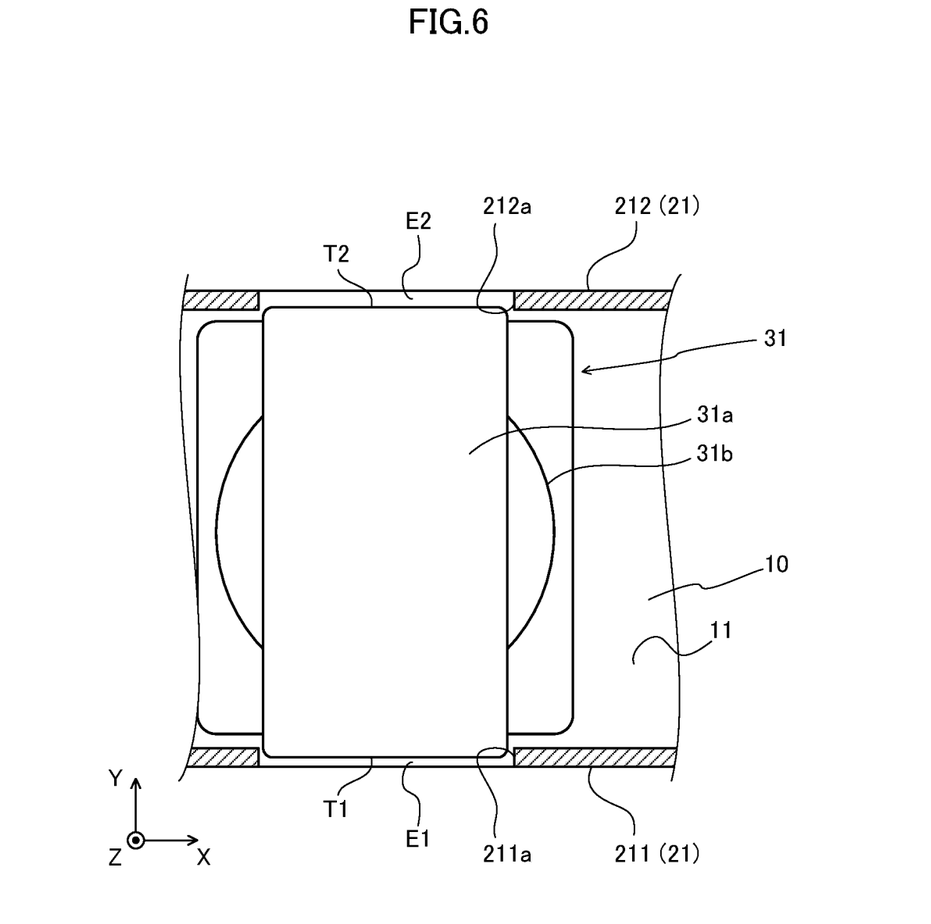
FIG. 6 is a schematic view for describing a positional relationship between a first side wall portion and a second side wall portion of the case according to the embodiment, and a specific circuit element mounted on the board.

In the present embodiment, as schematically illustrated in FIG. 6, the one end T1 of the transformer 31 is located within the notch portion 211*a* provided in the first side wall portion 211, and the other end T2 of the transformer 31 is located within the notch portion 212*a* provided in the second side wall portion 212. Thereby, compared to the case in which the notch portions 211*a* and 212*a* are not provided, the transformer 31 can be laid out up to vicinities of both ends in the Y direction of the board 10, and heat generated by the transformer 31 can be well radiated from the notch portions 211*a* and 212*a* to the outside of the case 20. Note that the expression "the one end T1 of the transformer 31 is located within the notch portion 211*a* provided in the first side wall portion 211" means that the one end T1 of the transformer 31 and that part of the first side wall portion 211, in which the notch portion 211*a* is provided, overlap in the X direction. The same applies to the positional relationship between the other end T2 of the transformer 31 and the notch portion 212*a*.

Note that the positional relationship between the transformer 31 and the first side wall portion 211 and second side wall portion 212 is not limited to the mode in which, as illustrated in FIG. 6, the one end T1 of the transformer 31 is located within the notch portion 211*a* provided in the first side wall portion 211, and the other end T2 of the transformer 31 is located within the notch portion 212*a* provided in the second side wall portion 212. Taking into account an error in the location of installation of the transformer 31 on the board 10, it suffices that the power supply apparatus 100 satisfies at least one of the condition that the one end T1 of the transformer 31 is located within the notch portion 211*a* provided in the first side wall portion 211, and the condition that the other end T2 of the transformer 31 is located within the notch portion 212*a* provided in the second side wall portion 212.

The leg portions 22*a* to 22*d*, which the case 20 includes, are provided to correspond to the corner portions 10*a* to 10*d* of the board 10, respectively. As illustrated in FIG. 5, the leg portion 22*a* and leg portion 22*b* constitute a first leg portion pair 51 located on the one diagonal D1 on the board 10. The leg portion 22*c* and leg portion 22*d* constitute a second leg portion pair 52 located on the other diagonal D2 on the board 10.

One leg portion 22*a* included in the first leg portion pair 51 is located on the outer peripheral side of the corner portion 10*a* of the board 10, as illustrated in FIG. 1. The leg portion 22*a* has a columnar shape, and a part thereof facing the board 10 side is formed in a shape which corresponds to the shape of the notch 13*a* provided in the corner portion 10*a* and which fits to the notch 13*a*. Outer surfaces of the leg portion 22*a* include a surface which is flush with the outer surface of the first side wall portion 211, and a surface which is flush with the outer surface of the third side wall portion 213. A location where these surfaces intersect is the corner of the leg portion 22*a*. A claw H1, which is hooked on the major surface 11 of the board 10, is formed on the leg portion 22*a*. As illustrated in FIG. 5, the claw H1 is formed by that part of a stepped portion provided in the leg portion 22*a*, which projects in the X direction (the right direction in FIG. 5).

The other leg portion 22*b* included in the first leg portion pair 51 is located on the outer peripheral side of the corner portion 10*b* of the board 10, as illustrated in FIG. 2. The leg portion 22*b* has a columnar shape, and a part thereof facing the board 10 side is formed in a shape which corresponds to the shape of the notch 13*b* provided in the corner portion 10*b* and which fits to the notch 13*b*. Outer surfaces of the leg portion 22*b* include a surface which is flush with the outer surface of the second side wall portion 212, and a surface which is flush with the outer surface of the fourth side wall portion 214. A location where these surfaces intersect is the corner of the leg portion 22*b*. A claw H2, which is hooked on the major surface 11 of the board 10, is formed on the leg portion 22*b*. As illustrated in FIG. 5, the claw H2 is formed by that part of a stepped portion provided in the leg portion 22*b*, which projects in the X direction (the left direction in FIG. 5).

One leg portion 22*c* included in the second leg portion pair 52 is located on the outer peripheral side of the corner portion 10*c* of the board 10, as illustrated in FIG. 1 and FIG. 2. The leg portion 22*c* has a columnar shape, and a part thereof facing the board 10 side is formed in a shape which corresponds to the shape of the notch 13*c* provided in the corner portion 10*c* and which fits to the notch 13*c*. Outer surfaces of the leg portion 22*c* include a surface which is flush with the outer surface of the second side wall portion 212, and a surface which is flush with the outer surface of the third side wall portion 213. A location where these surfaces intersect is the corner of the leg portion 22*c*. As illustrated in FIG. 2, a claw H3, which is hooked on the back surface 12 of the board 10, and a claw H4, which is hooked on the major surface 11 of the board 10, are formed on the leg portion 22*c*. The claw H3 and claw H4 are opposed to each other in the Z direction, with the board 10 being interposed, and clamp the board 10. As illustrated in FIG. 5, the claw H3 is provided on the leg portion 22*c* in a manner to project in the X direction (the right direction in FIG. 5). As illustrated in FIG. 5, the claw H4 is formed by that part of a stepped portion provided in the leg portion 22*c*, which projects in the X direction (the right direction in FIG. 5).

Figure 7:
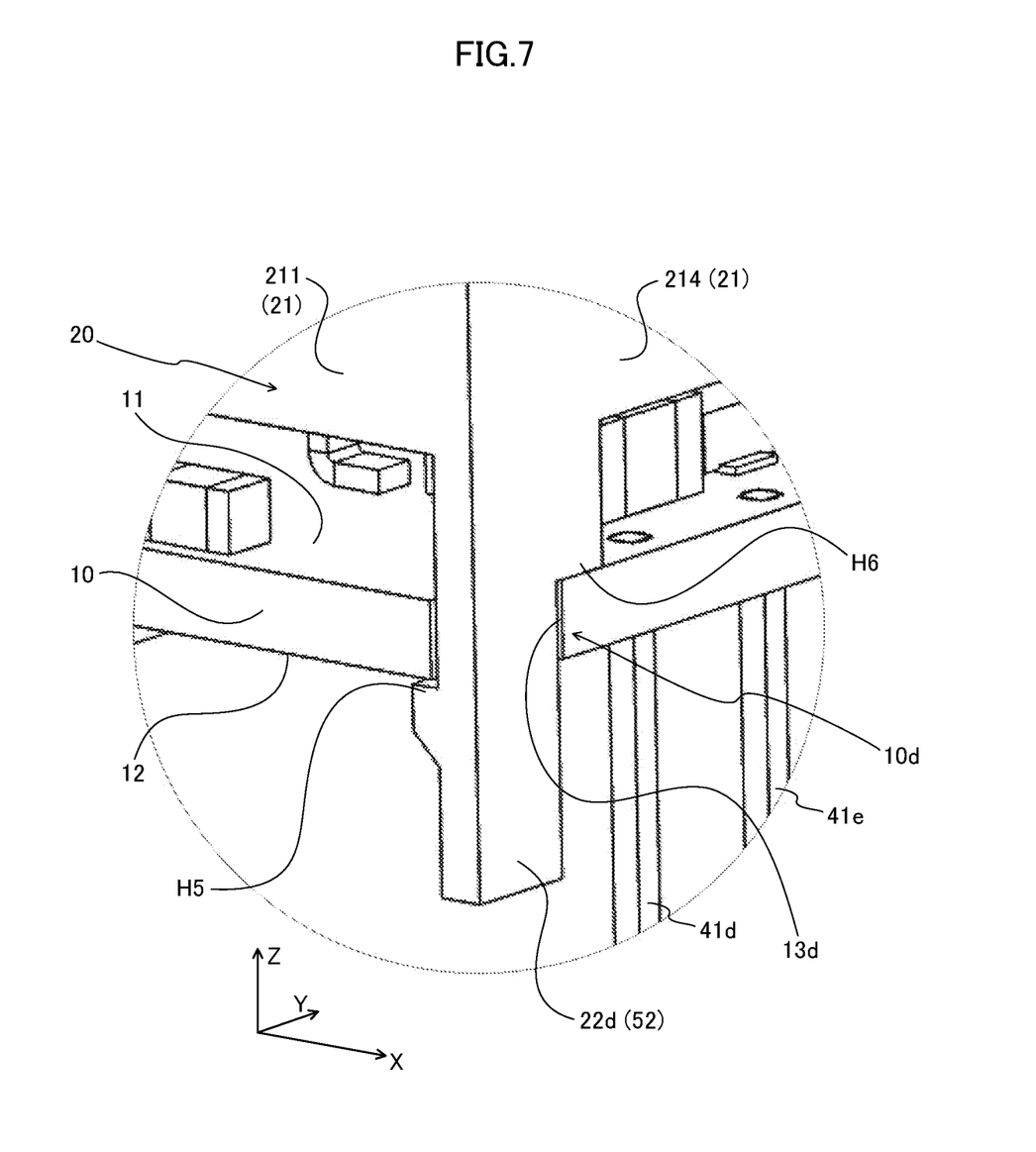
FIG. 7 is an enlarged perspective view of a specific leg portion of the case which the power supply apparatus according to the embodiment includes.

The other leg portion 22*d* (an example of a specific leg portion) included in the second leg portion pair 52 is located on the outer peripheral side of the corner portion 10*d* of the board 10, as illustrated in FIG. 1 and FIG. 2. The leg portion 22*d* has a columnar shape, and a part thereof facing the board 10 side is formed in a shape which corresponds to the shape of the notch 13*d* provided in the corner portion 10*d* and which fits to the notch 13*d*. Outer surfaces of the leg portion 22*d* include a surface which is flush with the outer surface of the first side wall portion 211, and a surface which is flush with the outer surface of the fourth side wall portion 214. A location where these surfaces intersect is the corner of the leg portion 22*d*. As illustrated in FIG. 7 in enlarged scale, a claw H5, which is hooked on the back surface 12 of the board 10, and a claw H6, which is hooked on the major surface 11 of the board 10, are formed on the leg portion 22*d*. The claw H5 is provided on the leg portion 22*d* in a manner to project in the X direction (the left direction in FIG. 7). The claw H6 is formed by that part of a stepped portion provided in the leg portion 22*d*, which projects in the Y direction (the right direction in FIG. 7). In the leg portion 22*d*, unlike the above-described leg portion 22*c*, the claw H5 and claw H6 are provided at such positions that the claw H5 and claw H6 are not opposed to each other in the Z direction, with the board 10 being interposed.

The case 20 is engaged with the board 10 by the claws H1 to H6 formed on the leg portions 22*a* to 22*d* as described above. Note that an expression "a predetermined leg portion among the leg portions 22a to 22d is engaged with the board 10" includes a mode in which the leg portions 22a to 22d including the claws H1 to H6, which are hooked on the board 10, cooperate, and thereby the case 20 is fixed to the board 10, and the expression does not necessarily mean that one leg portion alone is fixed to the board 10. In addition, all of the claws H1 to H6, which are hooked on the major surface 11 or back surface 12 of the board 10, may not always be in contact with the major surface 11 or back surface 12 of the board 10, and it suffices that the claws H1 to H6 are in contact with the major surface 11 or back surface 12, at least at a time of attaching the case 20 to the board 10. For example, when an installation surface is assumed to be present under the power supply apparatus 100 that is in the state illustrated in FIG. 2, the claw H4 may not be in contact with the major surface 11 of the board 10, while the claw H3 provided on the leg portion 22c is in contact with the back surface 12 of the board 10.

The claws H1 to H6 provided on the leg portions 22a to 22d are provided at such positions that the plate-shaped portion 210 of the case 20 is made substantially parallel to the board 10, when the claws H1 to H6 are engaged with the board 10. In addition, the outer surfaces of the leg portions 22a to 22d, which are fitted to the notches 13a to 13d, are flush with the side surfaces of the board 10 which are directed in the X direction or Y direction (that is, the surfaces other than the major surface 11 and back surface 12). In other words, when the case 20 is viewed in the Z direction, the leg portions 22a to 22d are provided in a manner to complement the parts of the notches 13a to 13d provided in the board 10. Thereby, the power supply apparatus 100, which is constructed by attaching the case 20 to the board 10, can be formed with an outer shape that is free from unnecessary irregularities. Besides, since the outer shape of the entirety of the power supply apparatus 100 can be made to fall within the range of desired dimensions, the power supply apparatus 100 can be reduced in size.

By the leg portions 22a to 22d provided with the claws H1 to H6 as described above, the case 20 is aligned with the board 10 in the following manner.

To begin with, since the case 20 is engaged with the corner portions 10a to 10d of the board 10 by the leg portions 22a to 22d from the outer peripheral side, the positions of the case 20 relative to the board 10 in the X and Y directions are restricted.

In addition, the position of the case 20 in a direction toward the major surface 11 of the board 10 is restricted by the claws H1 and H2 which are provided on the leg portions 22a and 22b constituting the first leg portion pair 51 located on the diagonal D1 and which come in contact with the major surface 11. On the other hand, the position of the case 20 in a direction away from the major surface 11 of the board 10 is restricted by the claws H3 and H5 which are provided on the leg portions 22c and 22d constituting the second leg portion pair 52 located on the diagonal D2 and which come in contact with the back surface 12. In other words, the position of the case 20 relative to the board 10 in the Z direction is restricted, the Z direction including a direction toward the major surface 11 of the board 10 and a direction away from the major surface 11. Note that, in the present embodiment, since the leg portions 22c and 22d constituting the second leg portion pair 52 are also provided with the claws H4 and H6 which come in contact with the major surface 11, the position of the case 20 in a direction toward the major surface 11 of the board 10 is restricted.

In the manner described above, the positions of the case 20 relative to the board 10 in the X, Y and Z directions are restricted, and the case 20 is attached to the board 10 in a stable attitude. Further, the case 20 includes, as an example of the specific leg portion, the leg portion 22d provided with the claw H5 and claw H6 which are located at such positions that the claw H5 and claw H6 are not opposed to each other in the Z direction, with the board 10 being interposed. The case 20 with this structure can keep a stabler attitude for reasons described below. As regards the leg portion 22d, since the claw H5 projecting in the X direction comes in contact with the back surface 12 of the board 10, the tilting motion of the leg portion 22d in a rotational direction around the Y axis and in a direction in which the claw H5 approaches the board 10 (hereinafter referred to as "tilting motion around the Y axis") is restricted. In addition, as regards the leg portion 22d, since the claw H6 projecting in the Y direction comes in contact with the major surface 11 of the board 10, the tilting motion of the leg portion 22d in a rotational direction around the X axis and in a direction in which the claw H6 approaches the board 10 (hereinafter referred to as "tilting motion around the X axis") is restricted. From the above, since the tilting motion around the Y axis and the tilting motion around the X axis of the leg portion 22d relative to the corner portion 10d of the board 10 are restricted, the leg portion 22d is stably attached to the corner portion 10d of the board 10.

As illustrated in FIG. 2, the leg portions 22a to 22d further extend from the major surface 11 of the board 10 toward the back surface 12 side, and the distal ends of the leg portions 22a to 22d are located closer to the board 10 than the distal ends of the pin terminals 41a to 41f. Specifically, a length L2 of each leg portion, 22a to 22d, from the back surface 12 is set to be equal, and is set to be less than the length L1 of each pin terminal, 41a to 41f, from the back surface 12. By adjusting the lengths of the leg portions 22a to 22d while satisfying this condition, the mounting structure to the electronic device of the target to which the power supply apparatus 100 is mounted (specifically, the length of insertion of the pin terminals 41a to 41f into the electronic device of the target to which the power supply apparatus 100 is mounted, and the position of the board 10 relative to the electronic device of the target) can be adjusted by using the structure of the case 20. In other words, according to the power supply apparatus 100 of the present embodiment, the leg portions 22a to 22d of the case 20 can be made to perform both the function as attachment parts to the board 10 and the function of adjusting the mounting structure of the power supply apparatus 100 to the electronic device of the target to which the power supply apparatus 100 is mounted, and therefore an increase in the number of components can be suppressed.

In the power supply apparatus 100 described above, the leg portions 22a to 22d are formed as corner-attachable leg portions which are located on the outer peripheral side of the board 10 and which are engaged with the corner portions 10a to 10d. Thus, notches for attaching the case 20 may not be formed in portions corresponding to sides of the board 10. In addition, the case 20 can be engaged with the board 10 by utilizing areas of the corner portions 10a to 10d of the board 10, where the circuit element group 30 is normally less frequently disposed and pattern wiring is normally less frequently formed. Therefore, a decrease in width of the board 10 by the area other than the corner portions 10a to 10d of the board 10 can be suppressed, and a decrease in area on the board 10, where circuit elements can be mounted, can be suppressed.

Note that the present disclosure is not limited by the above-described embodiment and the drawings. Modifications (including omission of structural elements) can be made as needed to the embodiment without departing from the spirit of the present disclosure.

(Modifications)

The shapes, sizes and materials of the board 10 and the case 20 are not limited to the above examples, and can be freely selected as far as the objective can be achieved. For example, in the above-described example, all of the leg portions 22a to 22d are formed as the corner-attached leg portions which are located on the outer peripheral side of the board 10 and are engaged with the corner portions 10a to 10d of the board 10, but the embodiment is not limited to this. If at least any one of the leg portions 22a to 22d is a corner-attachable leg portion corresponding to the corner portion of the board 10, notches for attaching the case 20 to locations corresponding to the sides of the board 10, and opening portions for attaching the case 20 to the inside of the board 10 can be reduced. Therefore, a decrease in area on the board 10, where circuit elements can be mounted, can be suppressed, and the rigidity of the board 10 can be secured.

In the above-described example, the leg portions 22a and 22b constituting the first leg portion pair 51 are provided with the claws H1 and H2 that are hooked on the major surface 11 of the board 10, and the leg portions 22c and 22d constituting the second leg portion pair 52 are provided with the claws H3 and H5 that are hooked on the back surface 12 of the board 10. However, the arrangement of the claws may be freely selected according to purposes. For example, in the leg portions 22c and 22d constituting the second leg portion pair 52, the claw H4 and claw H6 that are hooked on the major surface 11 can be omitted. In addition, in the leg portions 22a to 22d of the case 20, the arrangement pattern of the claws H1 to H6 may be changed according to the layout of circuit elements. For example, by changing the arrangement pattern of the claws H1 to H6, circuit elements can be disposed on areas of the board 10 avoiding the claws, such as a space on the back surface 12 side of the part of the board 10 where the claw contacting the major surface 11 is provided, and a space on the major surface 11 side of the part of the board 10 where the claw contacting the back surface 12 is provided.

In the above-described example, the leg portions 22a to 22d of the case 20 are engaged with the notches 13a to 13d provided in the corner portions 10a to 10d of the board 10. However, the embodiment is not limited to this. For example, such a configuration may be adopted that the leg portions 22a to 22d of the case 20 are engaged with the corner portions 10a to 10d of the board 10, which are not provided with the notches 13a to 13d. With this configuration, too, a decrease in area of the board 10, where circuit elements can be mounted, can be suppressed. However, from the standpoint of making compact the size of the outer shape of the case 20 relative to the board 10, while suppressing a decrease in area of the board 10, where circuit elements can be mounted, the notches 13a to 13d are preferably provided in the corner portions 10a to 10d of the board 10, as described above.

In the above-described example, the case 20 is formed of a resin, but the case 20 may be formed of a metal. By connecting the case 20 formed of a metal to a ground pattern provided on the board 10, the case 20 can be made to function as an electromagnetic wave shield. However, from the standpoint of easier forming of the case 20 and easier attachment of the case 20 to the board 10, the case 20 is preferably formed of a resin.

In the above-described example, the one end T1 of the transformer 31 that is an example of the specific circuit element reaches the one end portion E1 of the board 10, and the other end T2 of the transformer 31 reaches the other end E2 of the board 10. However, the embodiment is not limited to this. For example, of the one end T1 and the other end T2 of the transformer 31, only the one end T1 may reach the one end portion E1 of the board 10. In this case, the notch portion 211a for heat radiation may be provided in only the first side wall portion 211 of the case 20, and the notch portion 212a may not be provided in the second side wall portion 212.

In the above-described example, the power supply apparatus 100 is an insulation-type DC-DC converter, but the embodiment is not limited to this. The type of the power supply apparatus 100 may be freely selected if the power supply circuit that generates necessary output power from input power is formed on the board 10. For example, the power supply apparatus 100 may be a non-insulation-type DC-DC converter of a chopper method. In this case, the specific circuit element, which is the target of heat radiation by at least one of the notch portion 211a of the first side wall portion 211 and the notch portion 212a of the second side wall portion 212, may be a choke coil or the like. In addition, the power supply apparatus 100 may be an insulation-type AC-DC converter of a transformer method, and the specific circuit element may be a transformer that constitutes the converter. Besides, the specific circuit element may not be a circuit element with a largest outer shape among the circuit element group constituting the power supply circuit, and may be a freely selected circuit element with high necessity for heat radiation, which includes a portion reaching at least one of the one end portion E1 and the other end portion E2 of the board 10. As described above, which kind of circuit element is to be selected as the specific circuit element may be freely determined according to purposes, but the specific circuit element refers to a circuit element which is necessary for constituting the power supply circuit and which is other than a connector that needs to be exposed from the exterior for a functional reason. Furthermore, the arrangement of various kinds of circuit elements constituting the power supply circuit may be freely selected, and it suffices if at least circuit elements mounted on the major surface 11 of the board 10 are included.

(1-1) The above-described power supply apparatus 100 includes a board 10 including a major surface 11 on which a circuit element (for example, a freely selected circuit element among the circuit element group 30) is mounted; and a case 20 attached to the board 10. The case 20 includes a cover portion 21 located at a distance from the board 10 and covering the major surface 11 of the board 10, and a plurality of leg portions 22a to 22d extending from the cover portion 21 toward the board 10. The leg portions 22a to 22d include corner-attachable leg portions that are engaged with corner portions 10a to 10d of the board 10.

By this structure, as described above, a decrease in area of the board 10, where circuit elements can be mounted, can be suppressed.

(1-2) The power supply apparatus 100 includes, as the corner-attachable leg portions, a first leg portion pair 51 comprising a pair of leg portions, and a second leg portion pair 52 comprising a pair of leg portions that is different from the pair of leg portions of the first leg portion pair 51. The leg portions 22a and 22b constituting the first leg portion pair 51 include claws H1 and H2 that are hooked on the major surface 11 of the board 10, and the leg portions 22c and 22*d* constituting the second leg portion pair 52 include claws H3 and H5 that are hooked on the back surface 12 of the board 10.

By this structure, as described above, the case 20 can be attached to the board 10 in a stable attitude.

(1-3) The board 10 may be rectangular, the first leg portion pair 51 may be located on one diagonal D1 on the board 10, and the second leg portion pair 52 may be located on the other diagonal D2 on the board 10.

(1-4) At least one of the pair of leg portions constituting the first leg portion pair 51 or the second leg portion pair 52 includes both of a claw that is hooked on the major surface 11 and a claw that is hooked on the back surface 12.

In this manner, by the leg portion (for example, the leg portion 22*c* including the claws H3 and H4, or the leg portion 22*d* including the claws H5 and H6) including both the claw that is hooked on the major surface 11 and the claw that is hooked on the back surface 12, this leg portion can stably be engaged with a target part of the board 10.

(1-5) The leg portion including both of the claws described in the above (1-4) includes a specific leg portion (leg portion 22*d*) in which both of the claws are provided at positions where both of the claws are not opposed to each other, with the board 10 being interposed.

By this structure, as described above, since the tilting motion around the Y axis and the tilting motion around the X axis of the leg portion 22*d* functioning as the specific leg portion are restricted with respect to the corner portion 10*d* of the board 10, the leg portion 22*d* can stably be attached to the corner portion 10*d* of the board 10.

(1-6) Preferably, the corner-attachable leg portions (leg portions 22*a* to 22*d*) are engaged with parts provided with notches 13*a* to 13*d* in the corner portions 10*a* to 10*d* of the board 10.

By this structure, as described above, the power supply apparatus 100, which is constructed by attaching the case 20 to the board 10, can be formed with an outer shape that is free from unnecessary irregularities.

(1-7) In the power supply apparatus 100, the board 10 is provided with pin terminals 41*a* to 41*f* that are electrically connected to another device. The pin terminals 41*a* to 41*f* extend in a direction away from the back surface 12 of the board 10. In addition, distal ends of the leg portions 22*a* to 22*d* extend to the back surface 12 side of the board 10, and are located closer to the board 10 than distal ends of the pin terminals 41*a* to 41*f*.

By this structure, as described above, since the leg portions 22*a* to 22*d* can be made to perform both the function as attachment parts to the board 10 and the function of adjusting the attitude of the power supply apparatus 100 to the aforementioned another device, an increase in the number of components can be suppressed.

(2-1) In addition, in the power supply apparatus 100, one end T1 of a specific circuit element (for example, transformer 31) among the circuit element group 30 mounted on the major surface 11 of the board 10 reaches one end portion E1 of the board 10, the one end T1 of the specific circuit element being directed to the first side wall portion 211. Further, the first side wall portion 211 is provided with a notch portion 211*a* with a shape corresponding to the outer shape of the one end T1 of the specific circuit element.

By this structure, the heat radiation of the specific circuit element can be secured. Moreover, since the one end T1 of the specific circuit element can be located within the notch portion 211*a*, the circuit element group 30 including the specific circuit element can be well laid out.

(2-2) The case 20 includes, in addition to the first side wall portion 211, a second side wall portion 212 which is opposed to the first side wall portion 211 and extends from a plate-shaped portion 210 toward the other end portion E2 of the board 10. The second side wall portion 212 is provided with a notch portion 212*a* having a shape corresponding to the outer shape of the other end T2 of the specific circuit element.

By this structure, the heat radiation of the specific circuit element can be secured. Further, the specific element can be disposed on the board 10 such that the specific circuit element extends from the one end portion E1 to the other end portion E2 of the board 10.

(2-3) Preferably, the power supply apparatus 100 satisfies at least one of the condition that the one end T1 of the specific circuit element is located within the notch portion 211*a* provided in the first side wall portion 211, and the condition that the other end T2 of the specific circuit element is located within the notch portion 212*a* provided in the second side wall portion 212.

Thereby, as described above, an error (an error in the Y direction) of the installation position of the specific circuit element (for example, transformer 31) relative to the board 10 can be taken into account.

(2-4) The specific circuit element may be a transformer 31.

(2-5) The specific circuit element may be a circuit element with a largest outer shape among the circuit element group 30. Thereby, since the circuit element, which occupies a greatest area on the board 10, can be disposed up to end portions (one end portion E1 and the other end portion E2) of the board 10, the size of the board 10 can be reduced as much as possible with respect to the circuit elements that are necessary for constructing the power supply circuit. Moreover, the specific circuit element, which is assumed to have a higher necessity for heat radiation than other circuit elements, can be well heat-radiated.

In the above description, in order to make easier the understanding of the present disclosure, descriptions of publicly known technical matters are omitted unless where necessary.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A power supply apparatus comprising:
   a board including a major surface on which a circuit element group is mounted; and
   a case attached to the board, wherein
   the case includes
   a plate-shaped portion that is located at a distance from the board and faces the major surface,
   a side wall portion extending from the plate-shaped portion toward one end portion and located at a distance from the board, the one end portion including a side of the board, and
   a leg portion having an outer surface flush with an outer surface of the side wall portion, the leg portion being engaged with the board, the outer surface of the side wall portion and the outer surface of the leg portion are along the side of the board, one end of a specific circuit element among the circuit element group reaches the one end portion of the board, the one end of the specific circuit element being directed to the side wall portion, and the side wall portion is provided with a notch portion with a shape corresponding to an outer shape of the one end of the specific circuit element.

2. The power supply apparatus according to claim 1, wherein the case includes, in addition to a first side wall portion functioning as the side wall portion, a second side wall portion that is opposed to the first side wall portion and extends from the plate-shaped portion toward an other end portion of the board, and the second side wall portion is provided with a notch portion with a shape corresponding to an outer shape of an other end of the specific circuit element.

3. The power supply apparatus according to claim 2, wherein the power supply apparatus satisfies at least one of a condition that the one end of the specific circuit element is located within the notch portion provided in the first side wall portion, and a condition that the other end of the specific circuit element is located within the notch portion provided in the second side wall portion.

4. The power supply apparatus according to claim 1, wherein the specific circuit element is a transformer.

5. The power supply apparatus according to claim 2, wherein the specific circuit element is a transformer.

6. The power supply apparatus according to claim 3, wherein the specific circuit element is a transformer.

7. The power supply apparatus according to claim 1, wherein the specific circuit element is a circuit element with a largest outer shape among the circuit element group.

8. The power supply apparatus according to claim 2, wherein the specific circuit element is a circuit element with a largest outer shape among the circuit element group.

9. The power supply apparatus according to claim 3, wherein the specific circuit element is a circuit element with a largest outer shape among the circuit element group.

10. The power supply apparatus according to claim 4, wherein the specific circuit element is a circuit element with a largest outer shape among the circuit element group.

11. The power supply apparatus according to claim 5, wherein the specific circuit element is a circuit element with a largest outer shape among the circuit element group.

12. The power supply apparatus according to claim 6, wherein the specific circuit element is a circuit element with a largest outer shape among the circuit element group.

* * * * *